(12) United States Patent
Gider et al.

(10) Patent No.: US 11,860,244 B2
(45) Date of Patent: Jan. 2, 2024

(54) MAGNETOMETER WITH INTEGRATED RESET COILS

(71) Applicant: Apple Inc., Cupertino, CA (US)

(72) Inventors: Savas Gider, San Jose, CA (US); Chaitanya Mudivarthi, Sunnyvale, CA (US); Joyce M. Mullenix, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/992,860

(22) Filed: Nov. 22, 2022

(65) Prior Publication Data

US 2023/0089110 A1 Mar. 23, 2023

Related U.S. Application Data

(62) Division of application No. 16/376,725, filed on Apr. 5, 2019, now Pat. No. 11,513,169.

(51) Int. Cl.
*G01R 33/02* (2006.01)
*G01R 33/00* (2006.01)
*G01R 33/09* (2006.01)

(52) U.S. Cl.
CPC ......... *G01R 33/0017* (2013.01); *G01R 33/09* (2013.01)

(58) Field of Classification Search
CPC .. G01R 33/091; G01R 33/0011; G01R 33/09; G01R 33/0206; G01R 33/0017; G01R 33/025; G01R 33/07; G01R 33/06; G01R 33/063; G01R 33/093; G01R 33/0052; G01R 33/18; G01D 5/145; G01D 5/147; G01D 5/12; G01D 5/14; G01D 5/16; G01D 5/165; G01D 5/2457; G01D 5/2013; G01D 5/2046; G01D 5/24476; G01D 5/245; G01N 27/9033; G01N 27/902; G01N 27/9013; G01N 27/904; G01N 27/223; G01N 27/82; G01N 27/9093

See application file for complete search history.

(56) References Cited

U.S. PATENT DOCUMENTS

| | | | | |
|---|---|---|---|---|
| 4,158,811 | A | 6/1979 | Li et al. | |
| 4,427,940 | A * | 1/1984 | Hirama | G01N 27/82 324/206 |
| 6,541,967 | B1 * | 4/2003 | How | G01R 33/045 324/253 |
| 9,766,304 | B2 | 9/2017 | Paci | |
| 10,094,891 | B2 | 10/2018 | Paci et al. | |
| 10,288,697 | B2 | 5/2019 | Paci | |
| 11,513,169 | B2 | 11/2022 | Gider et al. | |
| 2005/0150295 | A1 * | 7/2005 | Wright | G01R 33/09 250/338.2 |
| 2012/0210562 | A1 * | 8/2012 | Jones | G01R 33/0035 324/202 |
| 2013/0265039 | A1 * | 10/2013 | Cai | G01R 33/098 324/252 |

(Continued)

*Primary Examiner* — Thang X Le
(74) *Attorney, Agent, or Firm* — Fish & Richardson P.C.

(57) ABSTRACT

Disclosed is a magnetometer architecture that couples one or more coils to a magnetic yoke to allow the reset of the magnetic yoke and one or more magnetic field sensors simultaneously after, for example, exposure to a large stray magnetic field. Also, disclosed is a magnetometer architecture that integrates separate magnetic pole pieces offset from the yoke that are each wound by a reset coil to allow reset of the one or more magnetic field sensors.

16 Claims, 3 Drawing Sheets

(56) References Cited

U.S. PATENT DOCUMENTS

| | | |
|---|---|---|
| 2016/0202329 A1 | 7/2016 | Paci |
| 2016/0231282 A1 | 8/2016 | Koenig et al. |
| 2017/0328961 A1* | 11/2017 | Lee ................. H10N 50/01 |
| 2019/0128974 A1* | 5/2019 | Bilbao De Mendizabal ............... G01R 33/0017 |
| 2019/0204396 A1 | 7/2019 | Ogomi et al. |
| 2020/0319265 A1 | 10/2020 | Gider et al. |

* cited by examiner

MAGNETOMETER WITH INTEGRATED RESET COILS

CROSS-REFERENCE TO RELATED APPLICATION

This application is a divisional of and claims priority to U.S. patent application Ser. No. 16/376,725, filed Apr. 5, 2019, the entire contents of which are incorporated herein by reference.

TECHNICAL FIELD

This disclosure relates generally to magnetometers.

BACKGROUND

A magnetometer is a sensor that measures the direction, strength or relative change of a magnetic field (e.g., the Earth's magnetic field) at a particular location. A digital compass found on many consumer products (e.g., smart phones) use a magnetometer to derive heading information to be used by a compass or navigation application. Since the Earth's magnetic field is small compared to stray magnetic fields generated by consumer products, the sensitivity of the magnetometer may change in response to the stray magnetic fields.

SUMMARY

Disclosed is a magnetometer architecture that couples one or more coils to a magnetic yoke to allow the reset of the magnetic yoke and one or more magnetic field sensors simultaneously after, for example, exposure to a large stray magnetic field. Also, disclosed is a magnetometer architecture that integrates separate magnetic pole pieces offset from the yoke that are each wound by a reset coil to allow reset of the one or more magnetic field sensors.

In an embodiment, a magnetometer comprises: a magnetic yoke; one or more reset coils coupled to the magnetic yoke; and one or more magnetic field sensors positioned relative to the magnetic yoke, the magnetic yoke and the one or more magnetic field sensors operable to simultaneously reset in response to current being applied to the one or more reset coils.

In an embodiment, an integrated circuit (IC) device comprises: a substrate; magnetometer disposed on the substrate, the magnetometer comprising: a magnetic yoke disposed on the substrate; one or more reset coils coupled to the magnetic yoke; and one or more magnetic field sensors disposed on the substrate and positioned relative to the magnetic yoke, the magnetic yoke and the one or more magnetic sensors operable to simultaneously reset in response to current being applied to the one or more reset coils.

In an embodiment, an electronic device comprises: a magnetometer comprising: a magnetic yoke; one or more reset coils coupled to the magnetic yoke; and one or more magnetic field sensors offset from the magnetic yoke, the magnetic yoke and the one or more sensors operable to simultaneously reset in response to current being applied to the one or more reset coils; one or more processors; memory storing instructions that when executed by the one or more processors, cause the one or more processors to perform operations comprising: obtaining, by the one or more processors from the magnetometer, magnetometer output data; and determining, by the one or more processors, a directional heading or orientation of the electronic device using the magnetometer output data.

In an embodiment, a method comprises: applying, using a current source, a current to one or more reset coils coupled to a magnetic yoke of a magnetometer, the current inducing an internal magnetic field in the magnetic yoke; and using the internal magnetic field to simultaneously reset the magnetic yoke and one or more magnetic field sensors of the magnetometer.

In an embodiment, a magnetometer comprises: a magnetic yoke; magnetic pole pieces offset from the magnetic yoke; a reset coil wrapped around each magnetic pole piece; and a magnetic field sensor offset from the magnetic yoke and the magnetic pole pieces, the magnetic field sensor operable to operate as a flux guide in response to current being applied to the reset coils.

In an embodiment, an integrated circuit (IC) device comprises: a substrate; a magnetometer disposed on the substrate, the magnetometer comprising: a magnetic yoke; magnetic pole pieces offset from the magnetic yoke; a reset coil wrapped around each magnetic pole piece; and a magnetic field sensor offset from the magnetic yoke and the magnetic pole pieces, the magnetic field sensor operable to operate as a flux guide in response to current being applied to the reset coils.

In an embodiment, an electronic device comprises: a magnetometer comprising: a magnetic yoke; magnetic pole pieces offset from the magnetic yoke; a reset coil wrapped around each magnetic pole piece; and a magnetic field sensor offset from the magnetic yoke and the magnetic pole pieces, the magnetic field sensor operable to operate as a flux guide in response to current being applied to the reset coils; one or more processors; memory storing instructions that when executed by the one or more processors, cause the one or more processors to perform operations comprising: obtaining, by the one or more processors from the magnetometer, magnetometer output data; and determining, by the one or more processors, a directional heading or orientation of the electronic device using the magnetometer output data.

In an embodiment, a method comprises: applying, using a current source, a current to coils coupled to magnetic pole pieces offset from a yoke in a magnetometer, the current inducing a magnetic field in the one or more magnetic pole pieces; and using the magnetic field to reset one or more magnetic field sensors of the magnetometer.

Particular embodiments disclosed herein provide one or more of the following advantages. The disclosed embodiments optimize the performance of a magnetometer, which in turn, improves the accuracy of magnetometer readings used by a digital compass and other applications running on a mobile device that require mobile device orientation data. In a first embodiment, the integration of reset coils in the magnetic yoke provides a low hysteresis magnetometer architecture that allows the magnetic yoke and the magnetic field sensor to be reset simultaneously to a uniform magnetic state after, for example, exposure to a stray magnetic field. The integrated architecture also allows a reduced foot print in the sense layer. In a second embodiment, reset coils are wound around magnetic pole pieces offset from the magnetic yoke that allows the magnetic field sensor to be reset to a uniform magnetic state.

The details of the disclosed implementations are set forth in the drawings and the description below. Other features, objects and advantages are apparent from the description, drawings and claims.

DESCRIPTION OF DRAWINGS

The same reference symbol used in various drawings indicates like elements.

DETAILED DESCRIPTION

Figure 1:
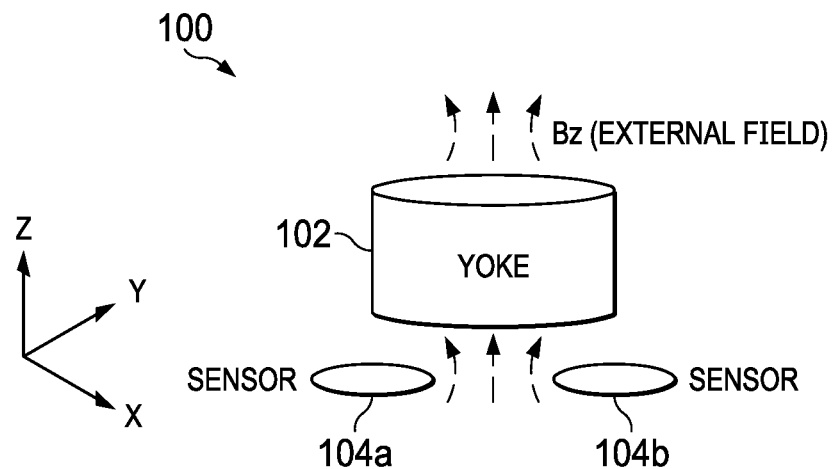
FIG. 1 is a conceptual diagram that illustrates the use of a magnetic yoke to divert flux to an in-plane magnetic field sensor of a magnetometer, according to an embodiment.

FIG. 1 is a conceptual diagram of magnetometer architecture 100 that includes magnetic yoke 102 to divert flux to in-plane magnetic field sensors 104a, 104b, according to an embodiment. Most thin film magnetic field sensors are sensitive only to external fields (Bx, By) in the XY plane of the thin film. This includes Anisotropic MR (AMR), Giant MR (GMR) and Tunneling MR (TMR) sensors. It is desired that an out-of-plane magnetometer respond to out-of-plane fields Bz (main axis Z sensitivity) and not to in-plane fields (cross-axis XY sensitivity).

One solution is to connect different magnetic field sensors with opposite responses in a Wheatstone bridge to cancel any in-plane fields. This solution is difficult to accomplish for both (XY) in-plane fields. Another solution uses magnetic yoke 102 as a shield for the cross-axis direction and to redirect the flux to in-plane magnetic field sensors 104a, 104b, as shown in FIG. 1.

Figure 2:
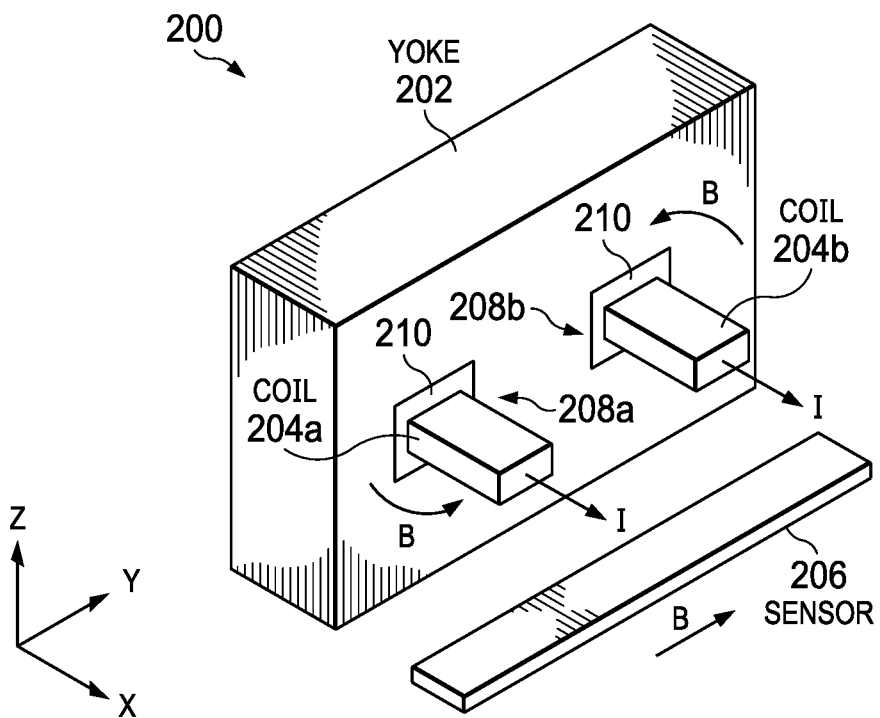
FIG. 2 is a conceptual diagram of a magnetometer architecture that includes a magnetic yoke with integrated reset coils, according to an embodiment.
Figure 3:
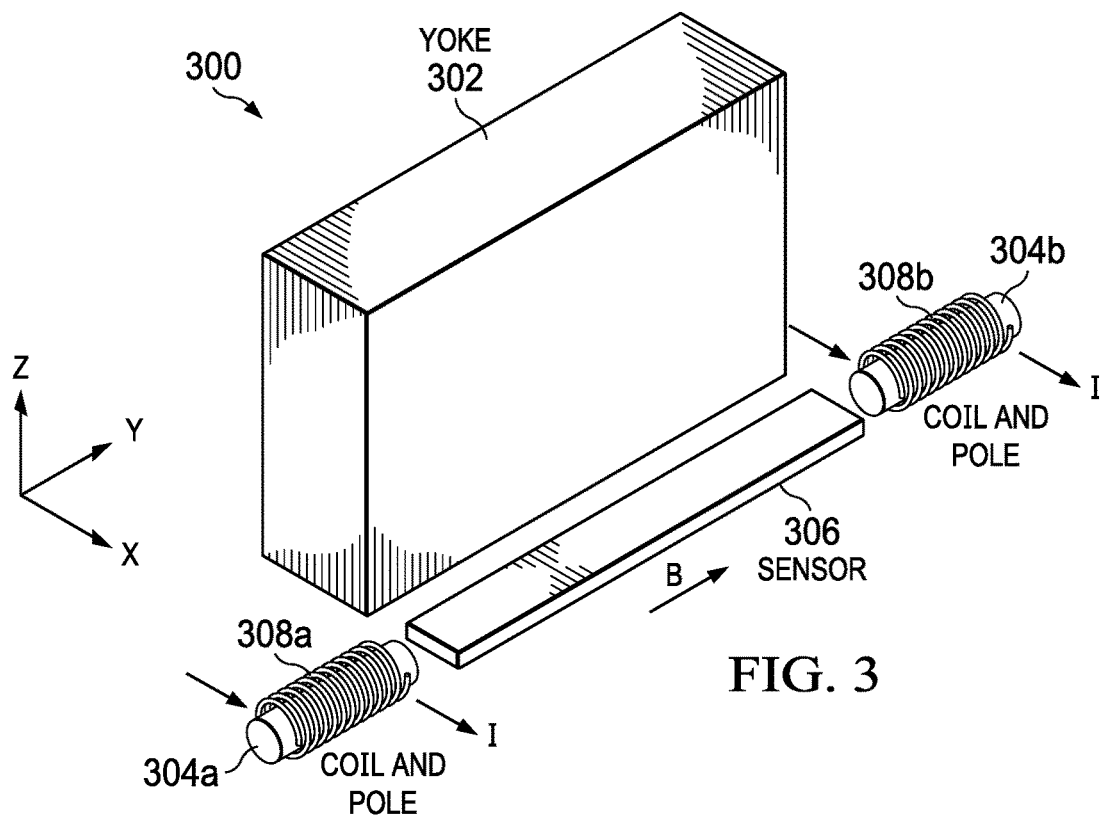
FIG. 3 is a conceptual diagram of a magnetometer architecture that includes a magnetic yoke and reset coils wound on magnetic pole pieces offset from the magnetic yoke, according to an embodiment.

Additionally, it is often desirable to reset a magnetic field sensor quickly after exposure to a large stray external magnetic field. One solution is to use an internal reset coil to generate an internal magnetic field to reset the magnetic field sensor. It is difficult, however, to incorporate both a reset coil and a magnetic yoke in the same design since both components need to be close to the magnetic field sensor for the reset to work properly. FIGS. 2 and 3 below illustrate alternative magnetometer architectures that include reset coils for resetting a magnetic yoke and/or magnetic field sensor(s) with low hysteresis.

FIG. 2 is a conceptual diagram of a magnetometer architecture including a yoke with integrated reset coils, according to an embodiment. The magnetometer architecture shown in FIG. 2 can be applied to both out-of-plane and in-plane sensors (e.g., Hall-effect).

In the example shown, magnetometer 200 includes magnetic yoke 202, reset coils 204a, 204b and magnetic field sensor 206. Magnetic yoke 202 includes a first opening 208a for receiving reset coil 204a. Magnetic yoke 202 includes a second opening 208b for receiving reset coil 204b. Openings 208a, 208b include insulator 210 (e.g., Al2O3, SiO2) to electrically insulate coils 204a, 204b from magnetic yoke 202. Also, baked photoresist can be used as an insulator in making coils 204a, 204b and yoke 202.

In this embodiment, magnetic field sensor 206 lies in the XY plane (in-plane sensor) and is offset from and runs parallel to magnetic yoke 202, as shown in FIG. 2. Magnetic field sensor 206 should be as close as possible to magnetic yoke 202 to allow magnetic yoke 202 to "bend" the out-of-plane magnetic field into the plane of magnetic field sensor 206. Regarding orientation, in general the long axis of magnetic field sensor 206 should be parallel to the long axis of magnetic yoke 202, such that the easy axis of magnetic field sensor 206 is parallel to the reset field generated by magnetic yoke 202.

Reset coils 204a, 204b can be single turn or multiple turn coils and each carries a current I in the same direction. Although two integrated reset coils are shown, any number of integrated reset coils with any number of turns can be used. Magnetic yoke 202, openings 208a, 208b and magnetic field sensor 206 can be any desired shape or size depending on the application. There can be any number of magnetic field sensors 206.

When magnetic field sensor 206 is measuring an external magnetic field there is no current I in reset coils 204a, 204b. When yoke 202 and/or magnetic field sensor 206 needs to be reset, current I is applied to reset coils 204a, 204b. Current I generates an internal magnetic field B that magnetizes magnetic yoke 202. Simultaneously, the magnetization of magnetic yoke 202 resets magnetic field sensor 206. In an embodiment, magnetic yoke 202 and/or magnetic field sensor 206 are reset after exposure to a large stray magnetic field. For example, a processing circuit can activate a current source coupled to reset coils 204a, 204b to generate current I periodically or in response to a trigger event.

FIG. 3 is a conceptual diagram of a magnetometer architecture that includes a magnetic yoke and reset coils wound on magnetic pole pieces offset from the magnetic yoke, according to an embodiment. The magnetometer architecture shown in FIG. 3 can be applied to both out-of-plane and in-plane sensors.

In the example shown, magnetometer 300 includes magnetic yoke 302, magnetic pole pieces 304a, 304b and magnetic field sensor 306. Reset coils 308a, 308b are wound around magnetic pole pieces 304a, 304b, respectively. Magnetic pole pieces 304a, 304b are offset from magnetic yoke 302 and centered on magnetic sensor 306, as shown in FIG. 3. Any number of magnetic pole pieces, reset coils and magnetic field sensors can be used in this design.

When the magnetic field sensor 306 is measuring an external magnetic field Bz, there is no current I in reset coils 308a, 308b. When magnetic field sensor 306 needs to be reset, current I is applied to reset coils 308a, 308b. Current I generates an internal magnetic field B that magnetizes pole pieces 304a, 304b and, in turn, also magnetizes magnetic field sensor 306. Magnetic pole pieces 304a, 304b amplify the magnetic fields generated by reset coils 308a, 308b, respectively, and sensor 306 acts as a flux guide. In an embodiment, magnetic pole pieces 304a, 304b are made of a soft magnetic material (e.g., NiFe, CoFe, FeSi, MnZn, NiZn) to minimize remanence. In an alternative embodiment, magnetic pole pieces 304a, 304b are made of a synthetic antiferromagnet (SAF) to minimize remanence (e.g., NiFe/Ru/NiFe, CoFe/Ru/CoFe, NiFe/CoFe/Ru/CoFe/NiFe).

In an embodiment, magnetometer 200 or 300 is implemented in a three-axis magnetic field sensor chip package that includes three magnetic field sensors mounted on a substrate, one for each magnetic field axis (X, Y, Z). The magnetic field sensors are wire bonded to processing circuitry. In another embodiment, there are separate chip packages for each magnetic field sensor. In yet another embodiment, there is a single system on chip (SoC) that includes the magnetometers and other sensors and processing circuitry.

In an embodiment, the magnetic field sensors can be coupled in a Wheatstone bridge configuration with each sensor arranged to maximize sensitivity and minimize temperature influences. In the presence of an external magnetic field, the resistance values of the magnetic sensors change, causing a bridge imbalance and generating an output voltage proportional to the magnetic field strength. The output voltage can be processed by the processing circuitry to generate raw magnetometer measurement data. The magnetometer sensor chip can be included in a consumer product (e.g., smart phone, tablet computer, wearable device), and the raw magnetometer measurement data can be made available to one or more applications (e.g., navigation applications) running on a host processor of the consumer product.

Figure 4A:
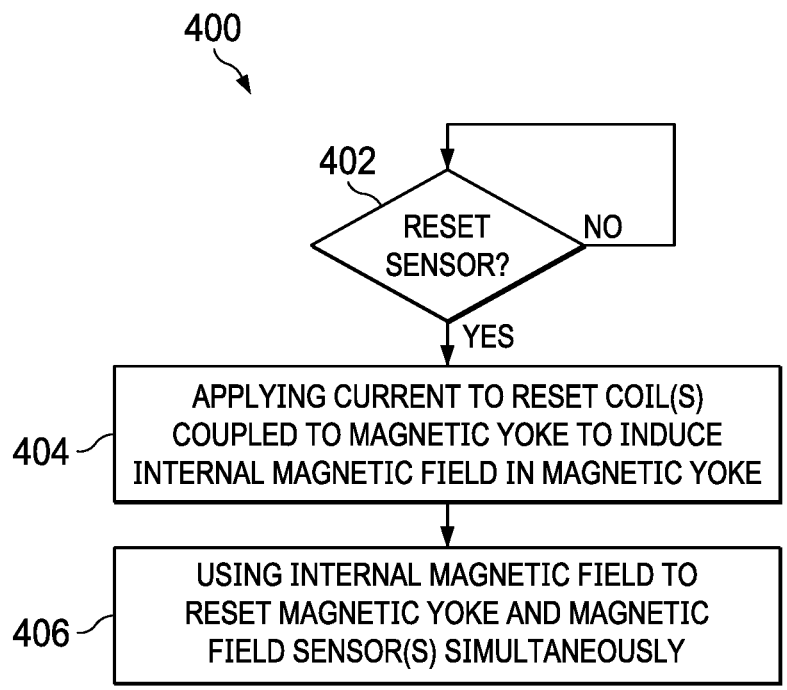
FIG. 4A is a flow diagram of a process of using one or more integrated reset coils coupled to a magnetic yoke to reset the magnetic yoke and one or more magnetic field sensors in a magnetometer, according to an embodiment.

FIG. 4A is a flow diagram of a process of using one or more integrated reset coils coupled to a magnetic yoke to reset the magnetic yoke and one or more magnetic field sensors in a magnetometer, according to an embodiment.

Process 400 can begin by determining whether a magnetic field sensor needs to be reset (402). In accordance with determining that a magnetic field sensor needs to be reset, process 400 continues by applying current to one or more reset coils coupled to a magnetic yoke to induce an internal magnetic field in the magnetic yoke (404). Process 400 continues by using the internal magnetic field induced in the magnetic yoke to reset the magnetic yoke and the one or more magnetic field sensors (406).

Figure 4B:
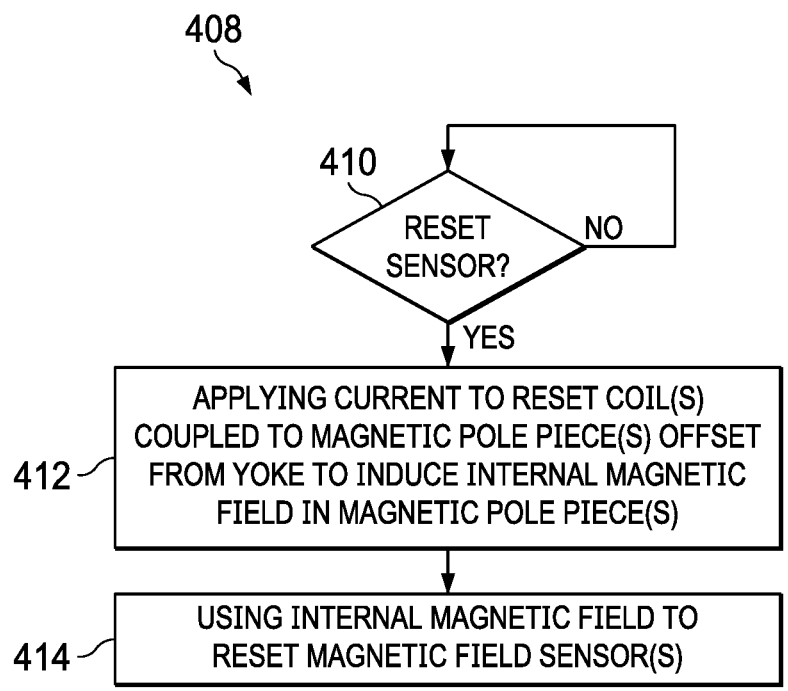
FIG. 4B is a flow diagram of a process of using one or more integrated reset coils coupled to one or more magnetic pole pieces to reset one or more magnetic field sensors in a magnetometer, according to an embodiment.

FIG. 4B is a flow diagram of a process of using one or more integrated reset coils coupled to one or more magnetic pole pieces to reset one or more magnetic field sensors in a magnetometer, according to an embodiment.

Process 408 can begin by determining whether a magnetic field sensor needs to be reset (410). In accordance with a determination that one or more magnetic field sensors need to be reset, process 408 continues by applying current to one or more reset coils coupled to one or more magnetic pole pieces to induce an internal magnetic field in the one or more magnetic pole pieces (412). Process 408 continues by using the internal magnetic field induced in the one or more magnetic pole pieces to reset the one or more magnetic field sensors (414).

Figure 5:
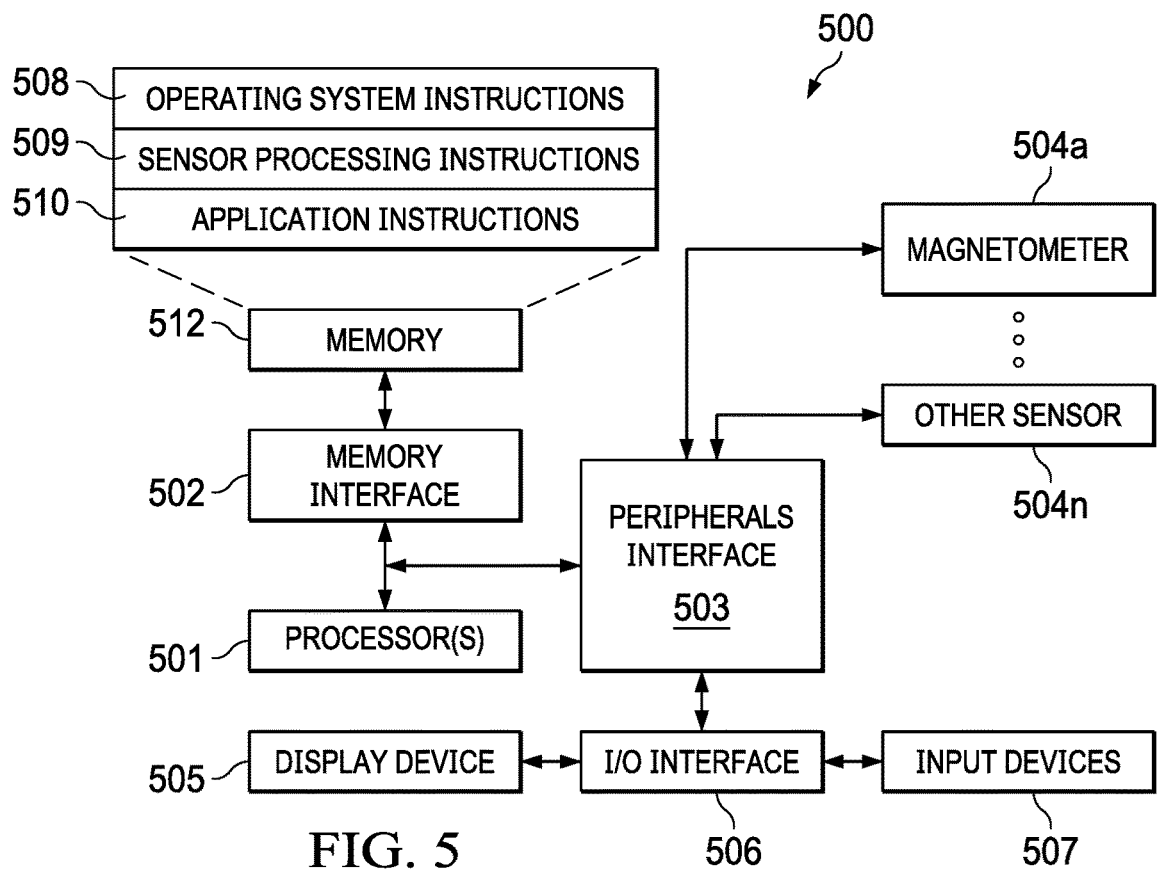
FIG. 5 is a block diagram of an electronic device architecture that includes at least one of the magnetometer architectures described in reference to FIGS. 2-4, according to an embodiment.

FIG. 5 is a block diagram of an electronic device architecture that includes at least one magnetometer as described in reference to FIGS. 2-4, according to an embodiment. Architecture 500 includes processor(s) 501, memory interface 502, peripherals interface 503, sensors 504a ... 504n, display device 505 (e.g., touch screen, LCD display, LED display), I/O interface 506 and input devices 507 (e.g., touch surface/screen, hardware buttons/switches/wheels, virtual or hardware keyboard, mouse). Memory 512 can include high-speed random access memory and/or non-volatile memory, such as one or more magnetic disk storage devices, one or more optical storage devices and/or flash memory (e.g., NAND, NOR).

Memory 512 stores operating system instructions 508, sensor processing instructions 509 and application instructions 510. Operating system instructions 508 include instructions for implementing an operating system on the device, such as iOS, Darwin, RTXC, LINUX, UNIX, WINDOWS, or an embedded operating system such as VxWorks. Operating system instructions 508 may include instructions for handling basic system services and for performing hardware dependent tasks. Sensor-processing instructions 509 perform post-processing on sensor data (e.g., averaging, scaling, formatting, calibrating) and provide control signals to sensors. Application instructions 510 implement software programs that use data from one or more sensors 504a ... 504n, such as navigation, digital pedometer, tracking or map applications, or any other application that needs heading or orientation data. At least one sensor 504a is a 3-axis magnetometer 200 or 300 as described in reference to FIGS. 1-4.

For example, in a digital compass application executed on a smartphone, the raw magnetometer output data is provided to processor(s) 501 through peripheral interface 503. Processor(s) 501 execute sensor-processing instructions 509, to perform further processing (e.g., averaging, formatting, scaling) of the raw magnetometer output data. Processor(s) 501 execute instructions for various applications running on the smartphone. For example, a digital compass uses the magnetometer data to derive heading information to be used by a compass or navigation application. The more accurate the magnetometer data the more accurate the heading calculation for the electronic device. Other applications are also possible (e.g., navigation applications, gaming applications, calibrating other sensors).

While this document contains many specific implementation details, these details should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A magnetometer comprising:
   a magnetic yoke;
   magnetic pole pieces offset from the magnetic yoke;
   a reset coil wrapped around each magnetic pole piece; and
   a magnetic field sensor offset from the magnetic yoke and the magnetic pole pieces, the magnetic field sensor operable to operate as a flux guide in response to current being applied to the reset coils.

2. The magnetometer of claim 1, wherein the magnetic pole pieces are in a plane with the magnetic field sensor and centered on the magnetic field sensor.

3. The magnetometer of claim 1, wherein the magnetic pole pieces are made of a soft magnetic material.

4. The magnetometer of claim 1, wherein the pole pieces are made of synthetic antiferromagnet (SAF).

5. The magnetometer of claim 1, wherein the current is applied to the reset coils when the magnetometer is reset.

6. An integrated circuit (IC) device, comprising:
a substrate;
a magnetometer disposed on the substrate, the magnetometer comprising:
a magnetic yoke;
magnetic pole pieces offset from the magnetic yoke;
a reset coil wrapped around each magnetic pole piece; and
a magnetic field sensor offset from the magnetic yoke and the magnetic pole pieces, the magnetic field sensor operable to operate as a flux guide in response to current being applied to the reset coils.

7. The IC of claim 6, wherein the magnetic pole pieces are in a plane with the magnetic field sensor and centered on the magnetic field sensor.

8. The IC of claim 6, wherein the magnetic pole pieces are made of a soft magnetic material.

9. The IC of claim 6, wherein the pole pieces are made of synthetic antiferromagnet (SAF).

10. The IC of claim 6, wherein the current is applied to the reset coils when the magnetometer is reset.

11. An electronic device, comprising:
a magnetometer comprising:
a magnetic yoke;
magnetic pole pieces offset from the magnetic yoke;
a reset coil wrapped around each magnetic pole piece; and
a magnetic field sensor offset from the magnetic yoke and the magnetic pole pieces, the magnetic field sensor operable to operate as a flux guide in response to current being applied to the reset coils;
one or more processors;
memory storing instructions that when executed by the one or more processors, cause the one or more processors to perform operations comprising:
obtaining, by the one or more processors from the magnetometer, magnetometer output data; and
determining, by the one or more processors, a directional heading or orientation of the electronic device using the magnetometer output data.

12. The electronic device of claim 11, wherein the magnetic pole pieces are in a plane with the magnetic field sensor and centered on the magnetic field sensor.

13. The electronic device of claim 11, wherein the magnetic pole pieces are made of a soft magnetic material.

14. The electronic device of claim 11, wherein the pole pieces are made of synthetic antiferromagnet (SAF).

15. A method comprising:
applying, using a current source, a current to reset coils wrapped around magnetic pole pieces offset from a yoke in a magnetometer, the current inducing a magnetic field in the one or more magnetic pole pieces; and
using the magnetic field to reset one or more magnetic field sensors of the magnetometer.

16. The method of claim 15, further comprising:
determining, by a processing circuit, whether the magnetometer is being reset or measuring external magnetic fields; and
in accordance with the magnetometer being reset, applying the current to the one or more reset coils.

* * * * *